United States Patent
Volkovich et al.

(10) Patent No.: US 12,222,199 B2
(45) Date of Patent: Feb. 11, 2025

(54) SYSTEMS AND METHODS FOR MEASUREMENT OF MISREGISTRATION AND AMELIORATION THEREOF

(71) Applicant: KLA Corporation, Milpitas, CA (US)

(72) Inventors: Roie Volkovich, Hadera (IL); Nachshon Rothman, DN Oshrat (IL); Yossi Simon, Haifa (IL); Anna Golotsvan, Qiryat Tivon (IL); Vladimir Levinski, Migdal HaEmek (IL); Nireekshan K. Reddy, Tel Aviv (IL); Amnon Manassen, Haifa (IL); Daria Negri, Nesher (IL); Yuri Paskover, Binyamina (IL)

(73) Assignee: KLA Corporation, Milpitas, CA (US)

( * ) Notice: Subject to any disclaimer, the term of this patent is extended or adjusted under 35 U.S.C. 154(b) by 799 days.

(21) Appl. No.: 17/254,253

(22) PCT Filed: Nov. 5, 2020

(86) PCT No.: PCT/US2020/058988
§ 371 (c)(1),
(2) Date: Dec. 18, 2020

(87) PCT Pub. No.: WO2022/098354
PCT Pub. Date: May 12, 2022

(65) Prior Publication Data
US 2022/0307824 A1    Sep. 29, 2022

(51) Int. Cl.
*G01B 11/27*    (2006.01)
*H01L 21/66*    (2006.01)
(Continued)

(52) U.S. Cl.
CPC ............ *G01B 11/27* (2013.01); *H01L 21/68* (2013.01); *H01L 22/00* (2013.01);
(Continued)

(58) Field of Classification Search
CPC ..... G01B 11/27; G01B 2210/56; H01L 21/68; H01L 22/00; H01L 22/12; H01L 22/20; H01L 22/10; G03F 7/70633
See application file for complete search history.

(56) References Cited

U.S. PATENT DOCUMENTS

| | | | |
|---|---|---|---|
| 10,203,200 B2 | 2/2019 | Marciano et al. | |
| 2004/0169861 A1* | 9/2004 | Mieher | G03F 7/70625 356/400 |

(Continued)

FOREIGN PATENT DOCUMENTS

| | | |
|---|---|---|
| TW | 202004947 A | 1/2020 |
| WO | 2020122996 A1 | 6/2020 |
| WO | 2020185242 A1 | 9/2020 |

OTHER PUBLICATIONS

Wikipedia ("Interferometry." Wikipedia, The Free Encyclopedia. Wikipedia, The Free Encyclopedia, Oct. 26, 2020) (Year: 2020).*

(Continued)

*Primary Examiner* — Lisa M Caputo
*Assistant Examiner* — Christian T Bryant
(74) *Attorney, Agent, or Firm* — Hodgson Russ LLP

(57) ABSTRACT

A system for use with a misregistration metrology tool (MMT), the system including a database including a plurality of process variation (PV) categories and a corresponding plurality of parameter sets and a process variation accommodation engine (PVAE) including a measurement site process variation category associator (MSPVCA) operative to associate a measurement site being measured by the MMT, at least partially based on an MMT output relating to the measurement site, with a measurement site process variation category (MSPVC), the MSPVC being one of the plurality of PV categories, a measurement site parameter set retriever (MSPSR) operative to retrieve a measurement site parameter set (MSPS) corresponding to the MSPVC and a measurement site parameter set communicator (MSPSC) operative to communicate the MSPS to the MMT.

22 Claims, 3 Drawing Sheets

(51) Int. Cl.
*H01L 21/68* (2006.01)
*G03F 7/00* (2006.01)

(52) U.S. Cl.
CPC ...... *G01B 2210/56* (2013.01); *G03F 7/70633* (2013.01); *H01L 22/10* (2013.01); *H01L 22/12* (2013.01)

(56) References Cited

U.S. PATENT DOCUMENTS

| | | | |
|---|---|---|---|
| 2005/0195398 A1* | 9/2005 | Adel | B82Y 10/00 356/401 |
| 2006/0265097 A1 | 11/2006 | Roberts et al. | |
| 2015/0371908 A1 | 12/2015 | Bencher et al. | |
| 2016/0148850 A1 | 5/2016 | David | |
| 2017/0336198 A1* | 11/2017 | Adel | G01B 11/272 |
| 2019/0208108 A1 | 7/2019 | Gutman et al. | |
| 2019/0295905 A1 | 9/2019 | Clark | |
| 2020/0286794 A1 | 9/2020 | Volkovich et al. | |
| 2021/0011073 A1 | 1/2021 | Katz et al. | |
| 2021/0142466 A1 | 5/2021 | Ophir et al. | |
| 2022/0108128 A1 | 4/2022 | Lavert et al. | |

OTHER PUBLICATIONS

WIPO, ISR for International Application No. PCT/US2020/058988, Aug. 2, 2021.

Sullivan & Shin, Overlay Metrology: the Systematic, the Random and the Ugly, 1998, AIP Conf. Proc. 449, 502-512.

TIPO, Office Action issued for TW Application No. 109142853, Apr. 19, 2024. See X/Y/A reference at p. 11.

* cited by examiner

SYSTEMS AND METHODS FOR MEASUREMENT OF MISREGISTRATION AND AMELIORATION THEREOF

REFERENCE TO RELATED APPLICATIONS

Reference is hereby made to the following patent and patent applications of the Applicant, which are related to the subject matter of the present application, the disclosures of which are hereby incorporated by reference:

U.S. Pat. No. 10,203,200 entitled ANALYZING ROOT CAUSES OF PROCESS VARIATION IN SCATTEROMETRY METROLOGY;

U.S. patent application Ser. No. 15/562,556, filed Aug. 25, 2017 and entitled DIRECT FOCUSING WITH IMAGE BINNING IN METROLOGY TOOLS;

U.S. patent application Ser. No. 16/619,847, filed Dec. 5, 2019 and entitled DATA-DRIVEN MISREGISTRATION PARAMETER CONFIGURATION AND MEASUREMENT SYSTEM AND METHOD;

U.S. patent application Ser. No. 16/640,783, filed Feb. 21, 2020 and entitled MACHINE LEARNING FOR METROLOGY MEASUREMENTS;

U.S. patent application Ser. No. 17/060,372, filed Oct. 1, 2020 and entitled SYSTEM AND METHOD FOR DETERMINING TARGET FEATURE FOCUS IN IMAGE-BASED OVERLAY METROLOGY; and PCT Patent Application No. PCT/US2019/033019, filed May 19, 2019 and entitled DYNAMIC AMELIORATION OF MISREGISTRATION MEASUREMENT.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a system for use with a misregistration metrology tool (MMT), the system including a database including a plurality of process variation (PV) categories and a corresponding plurality of parameter sets and a process variation accommodation engine (PVAE) including a measurement site process variation category associator (MSPVCA) operative to associate a measurement site being measured by the MMT, at least partially based on an MMT output relating to the measurement site, with a measurement site process variation category (MSPVC), the MSPVC being one of the plurality of PV categories, a measurement site parameter set retriever (MSPSR) operative to retrieve a measurement site parameter set (MSPS) corresponding to the MSPVC and a measurement site parameter set communicator (MSPSC) operative to communicate the MSPS to the MMT.

In accordance with a preferred embodiment of the present invention, the MSPS is used by the MMT in one of measuring the measurement site, thereby generating misregistration measurement data, analyzing misregistration measurement data generated by the MMT, thereby generating at least one quality metric of the measurement site, and measuring the measurement site, thereby generating misregistration measurement data, and analyzing the misregistration measurement data, thereby generating at least one quality metric of the measurement site.

Preferably, the plurality of PV categories characterize at least one of a thickness of at least one layer, a dielectric constant of at least one layer, a refractive index of at least one layer, a stress of at least one layer, a strain of at least one layer and a surface roughness of the measurement site.

In a preferred embodiment of the present invention, the system reports a value for at least one of the thickness of at least one layer, the dielectric constant of at least one layer, the refractive index of at least one layer, the stress of at least one layer, the strain of at least one layer and the surface roughness of the measurement site.

In a preferred embodiment of the present invention, the system alerts a user if a predetermined tolerance is exceeded by at least one of the thickness of at least one layer, the dielectric constant of at least one layer, the refractive index of at least one layer, the stress of at least one layer, the strain of at least one layer and the surface roughness of the measurement site.

In accordance with a preferred embodiment of the present invention, the MMT output includes a reflectance of the measurement site. In accordance with a preferred embodiment of the present invention, the MMT output includes a spectral dependency of a reflectance of the measurement site. In accordance with a preferred embodiment of the present invention, the MMT output includes a location of the measurement site on the wafer.

In accordance with a preferred embodiment of the present invention, the MMT includes an imaging-based MMT. Preferably, the MMT output includes a Linnik interferogram shape relating to the measurement site. Preferably, the Linnik interferogram shape includes at least one of a Linnik interferogram amplitude, a Linnik interferogram center of mass and a Linnik interferogram approximate symmetry.

In a preferred embodiment of the present invention, the MMT output includes a tool-induced-shift (TIS) value of the measurement site. Preferably, the TIS value is an estimated TIS value, the estimated TIS value being based on an output signal generated by a single measurement of a measurement site and an estimation model.

In a preferred embodiment of the present invention, the MMT output includes a focus offset value of the measurement site. Preferably, the focus offset value is a machine-learning focus value, the machine-learning focus value being generated by a machine-learning method.

Alternatively, in accordance with a preferred embodiment of the present invention, the MMT includes a scatterometry-based MMT. Preferably, the MMT output includes an arc position within an output signal generated by the scatterometry MMT.

In a preferred embodiment of the present invention, the MSPS includes suitable values of one or more measurement parameters. Preferably, the one or more measurement parameters includes at least one of a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest within the measurement site, a polarization of light used in misregistration measurement, at least one value of at least one wavelength of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement, a numerical aperture used in misregistration measurement, a camera used in misregistration measurement and a focus offset value used in misregistration measurement.

In accordance with a preferred embodiment of the present invention, the MSPS includes analysis algorithm parameters. Preferably, the analysis algorithm parameters include at least one of weighting rules and geometric corrections.

In accordance with a preferred embodiment of the present invention, the PVAE communicates the MSPS to the MMT less than 5 s after the MMT output is provided to the PVAE.

There is also provided in accordance with another preferred embodiment of the present invention a system for measuring misregistration of a plurality of measurement sites on a semiconductor device wafer, the system including a misregistration metrology tool (MMT) operative to provide an MMT output relating to a measurement site being measured thereby, a database including a plurality of process variation (PV) categories and a corresponding plurality of parameter sets and a process variation accommodation engine (PVAE) including a measurement site process variation category associator (MSPVCA) operative to associate the measurement site being measured by the MMT, at least partially based on the MMT output, with a measurement site process variation category (MSPVC), the MSPVC being one of the plurality of PV categories, a measurement site parameter set retriever (MSPSR) operative to retrieve a measurement site parameter set (MSPS) corresponding to the MSPVC and a measurement site parameter set communicator (MSPSC) operative to communicate the MSPS to the MMT.

Preferably, the MSPS is used by the MMT in one of measuring the measurement site, thereby generating misregistration measurement data, analyzing misregistration measurement data generated by the MMT, thereby generating at least one quality metric of the measurement site, and measuring the measurement site, thereby generating misregistration measurement data, and analyzing the misregistration measurement data, thereby generating at least one quality metric of the measurement site.

There is further provided in accordance with yet another preferred embodiment of the present invention a method for measuring misregistration of a plurality of measurement sites on a semiconductor device wafer, the method including providing a plurality of process variation (PV) categories with a corresponding plurality of parameter sets, generating a misregistration metrology tool (MMT) output relating to a measurement site being measured by an MMT, associating the measurement site being measured by the MMT, at least partially based on the MMT output, with a measurement site process variation category (MSPVC), the MSPVC being one of the plurality of PV categories, retrieving a measurement site parameter set (MSPS) corresponding to the MSPVC and communicating the MSPS to the MMT.

Preferably, the method also includes using the MSPS in a generation of at least one quality metric of the measurement site, and the generation of the at least one quality metric includes measuring the measurement site, thereby generating a corresponding plurality of misregistration measurement data, and analyzing the misregistration measurement data, thereby generating the at least one quality metric, and the MSPS is preferably used in at least one of the measuring the measurement site and the analyzing the misregistration measurement data.

In accordance with a preferred embodiment of the present invention, the method also includes using the at least one quality metric in a fabrication process of a semiconductor device wafer.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1A:
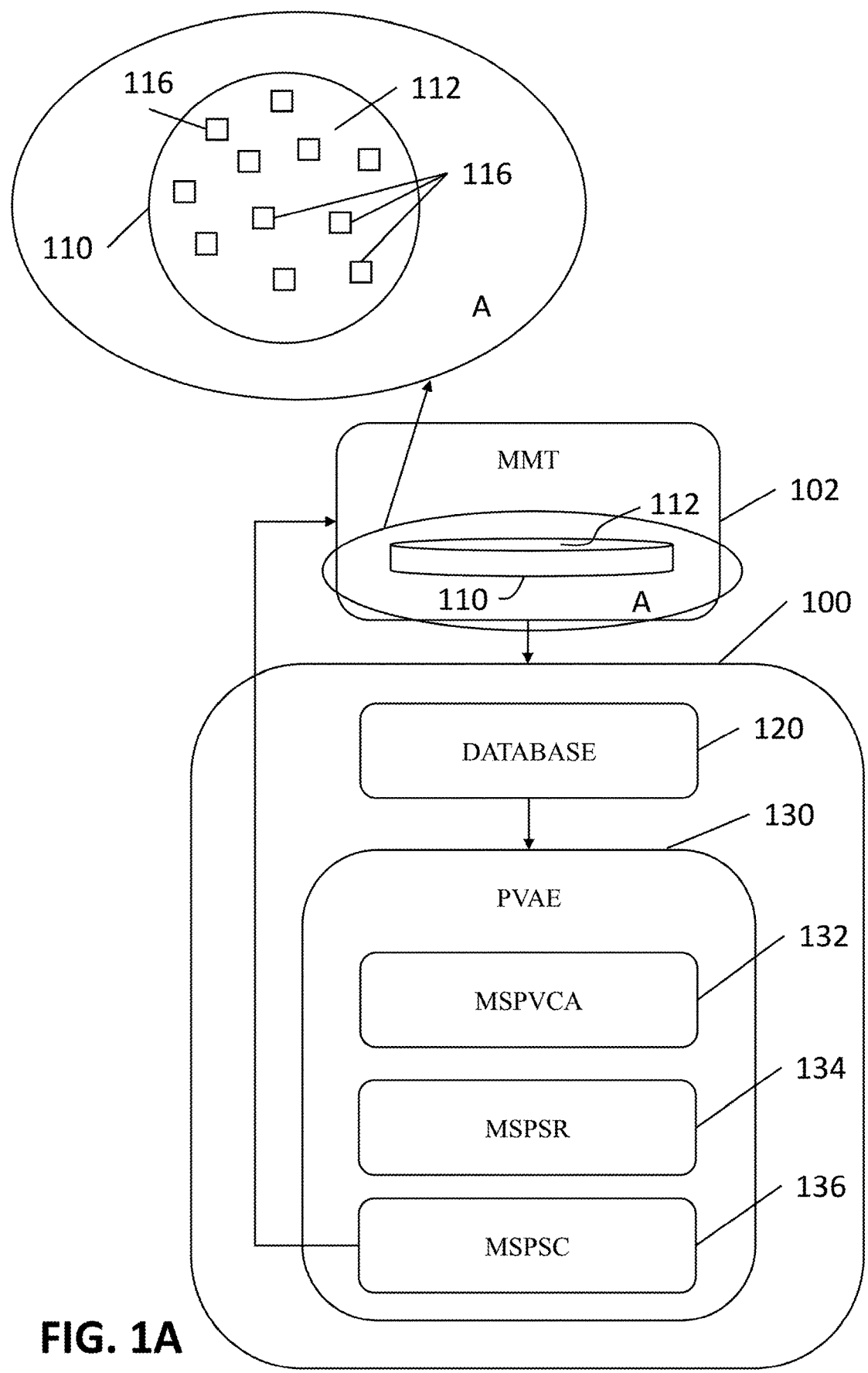
FIG. 1A is a simplified schematic illustration of a preferred embodiment of a system of the present invention.
Figure 1B:
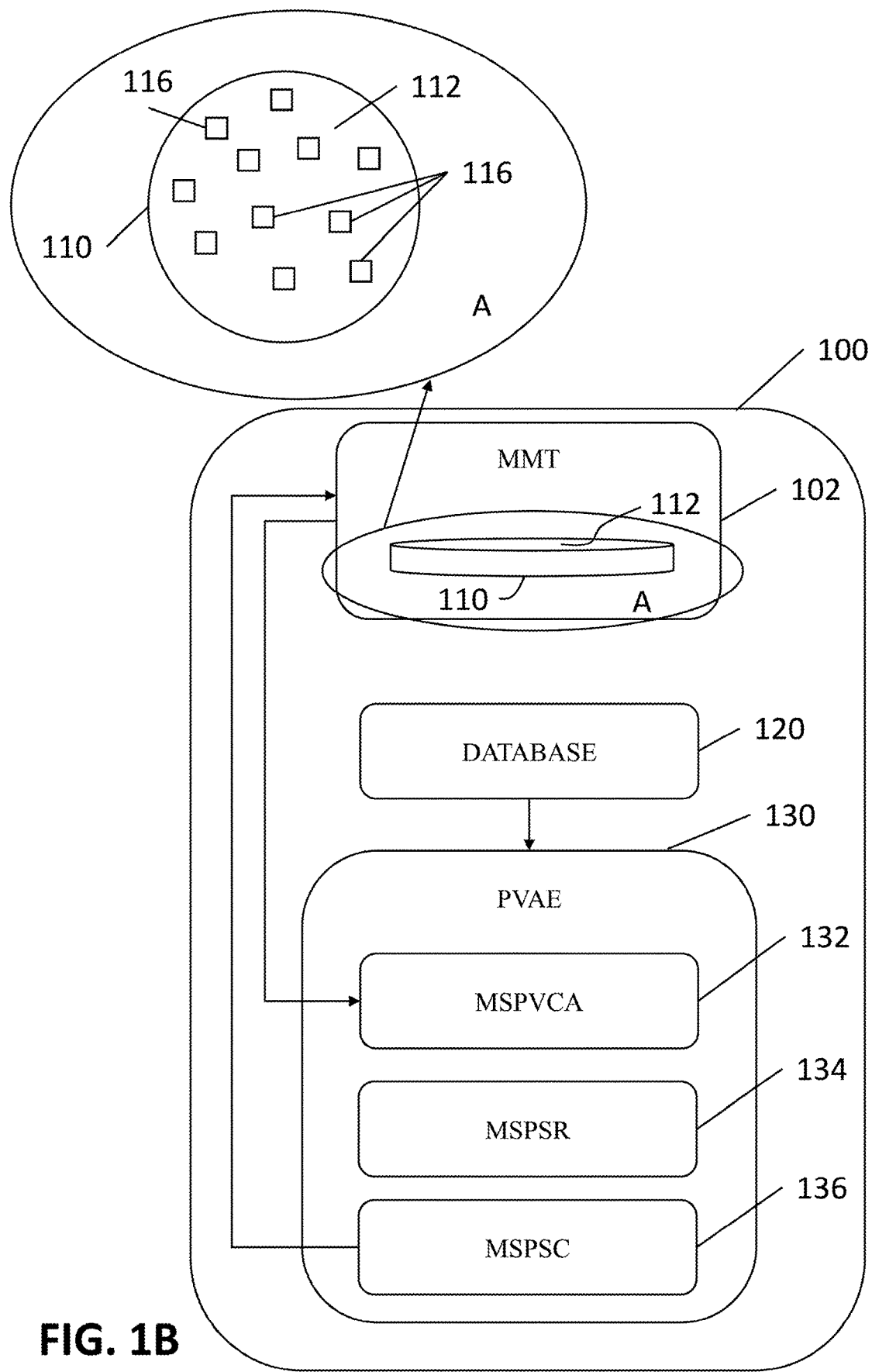
FIG. 1B is a simplified schematic illustration of another preferred embodiment of a system of the present invention.
Figure 2:
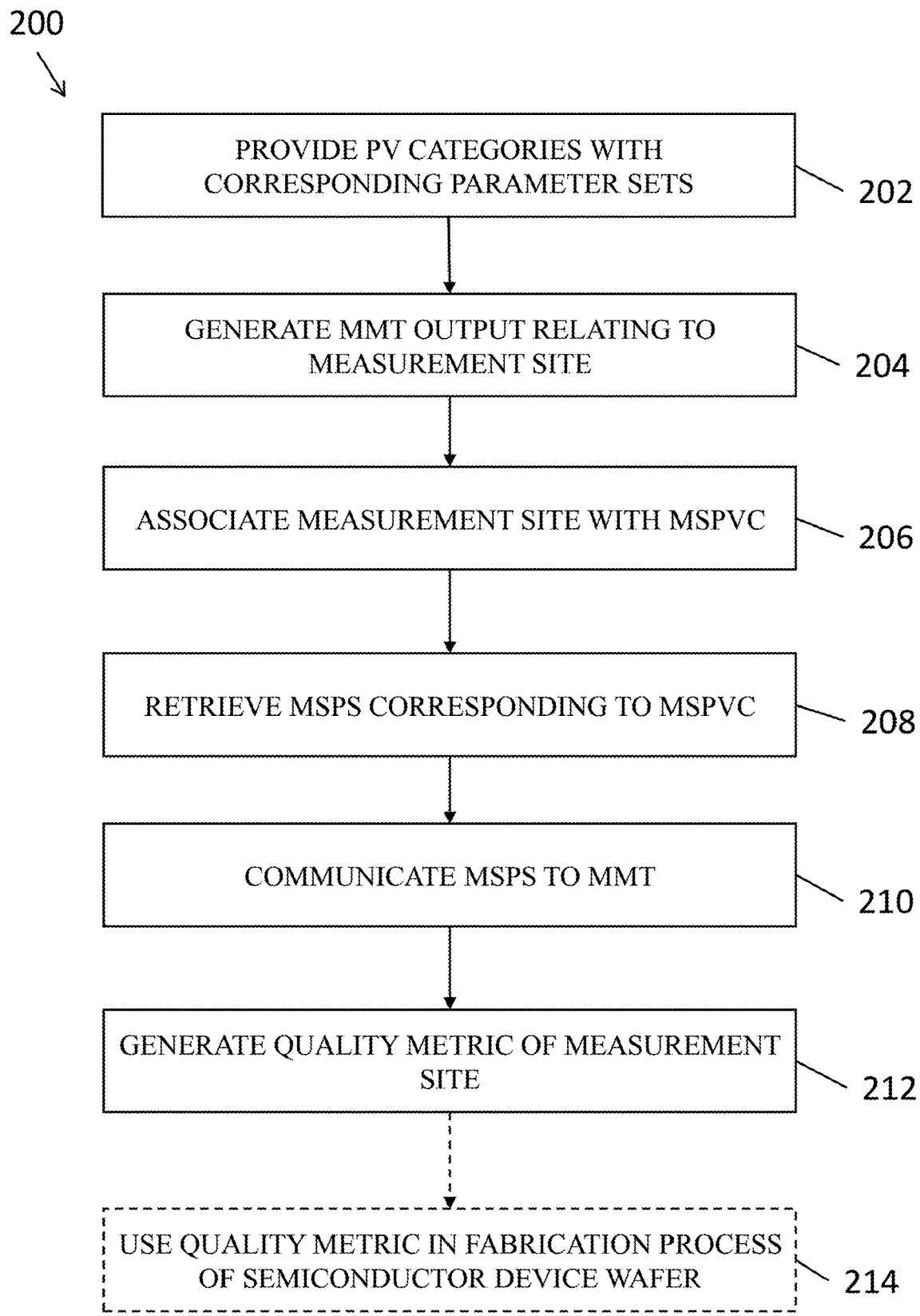
FIG. 2 is a simplified flowchart illustrating a method for use with the systems of FIGS. 1A and 1B.

It is appreciated that the system and method described hereinbelow with reference to FIGS. 1 & 2 are preferably used to measure misregistration between different layers of semiconductor devices and are part of a manufacturing process for semiconductor devices. The misregistration measured by the system and method described hereinbelow with reference to FIGS. 1 & 2 is preferably used to adjust fabrication processes, such as lithography, during the manufacturing of semiconductor devices, to ameliorate misregistration between various layers of the semiconductor devices being fabricated.

Typically, in the manufacture of semiconductor devices having multiple patterned layers, it is required that the various layers be maintained in strict spatial registration, preferably to within a tolerance of less than 10 nm, and more preferably to within a tolerance of less than 3 nm.

In order to maintain the spatial registration of the various layers of the semiconductor devices being formed on a semiconductor device wafer, misregistration is typically measured multiple times throughout a fabrication process of the semiconductor devices. In order to improve the quality of the misregistration measurements, measurement sites having different physical characteristics are preferably measured and/or analyzed using parameter sets that are particularly suited for those physical characteristics. It is appreciated that hereinbelow, "different physical characteristics" are referred to as "process variations," since these different physical characteristics are typically the result of process variations.

However, determining process variations and associated suitable parameter sets is typically a time-consuming process which impacts fabrication throughput, reducing a number of semiconductor devices that can be fabricated per hour. Therefore, the present invention seeks to provide improved, relatively fast systems and methods for the identification of process variations and provision of parameter sets particularly suitable for use when measuring misregistration between different layers of semiconductor devices.

Reference is now made to FIGS. 1A & 1B, which are each a simplified schematic diagram of a preferred embodiment of a system 100 for use with a misregistration metrology tool (MMT) 102. It is appreciated that, for ease of understanding, FIGS. 1A & 1B are not drawn to scale. It is further appreciated that while in the embodiment illustrated in FIG. 1A, system 100 is separate from MMT 102, in the embodiment illustrated in FIG. 1B, system 100 includes MMT 102.

MMT 102 may be any suitable MMT, such as an imaging-based MMT or a scatterometry-based MMT. A typical imaging-based MMT useful as MMT 102 is an Archer™ 750, commercially available from KLA Corporation of Milpitas, CA, USA. A typical scatterometry misregistration metrology tool useful as MMT 102 is an ATL™ 100, commercially available from KLA Corporation of Milpitas, CA, USA.

MMT 102 is preferably operative to measure misregistration between at least two layers formed on a semiconductor device wafer (SDW) 110, having a top surface 112. As seen particularly in enlargement circle A, MMT 102 preferably measures a plurality of measurement sites 116 on one or more SDWs 110. It is appreciated that measurement sites 116 may be any suitable shape and dimension. Similarly, SDW 110 may have any suitable number of measurement sites 116 having any suitable distribution thereupon. In one embodiment of the present invention, at least some of measurement sites 116 are intended to be identical or nearly identical to one another. In another embodiment of the present invention, measurement sites 116 intentionally differ from each other.

It is appreciated that the misregistration measurement performed by MMT 102 preferably includes measuring measurement site 116, thereby generating misregistration measurement data relating to measurement site 116, and analyzing the misregistration measurement data generated by MMT 102, thereby generating at least one quality metric of measurement site 116. In a preferred embodiment of the present invention, the quality metric indicates a misregistration values for the different layers between which misregistration was measured at measurement site 116.

Both in an embodiment wherein measurement sites 116 are intended to be identical or nearly identical to one another and in an embodiment wherein measurement sites 116 intentionally differ from each other, measurement sites 116 typically exhibit process variations with respect to one another. The process variations are typically present both between measurement sites 116 on a single SDW 110 and between measurement sites 116 on different ones of SDWs 110.

The process variations may incorporate at least one of a difference between corresponding ones of, inter alia, a thickness of at least one layer, a dielectric constant of at least one layer, a refractive index of at least one layer, a stress of at least one layer, a strain of at least one layer and a surface roughness of measurement sites 116. It is appreciated that as used herein, stress and strain refer to a mechanical stress and a mechanical strain, respectively.

System 100 preferably includes a database 120, including a plurality of process variation (PV) categories and a corresponding plurality of parameter sets. Each of the PV categories characterizes at least one of a thickness of at least one layer, a dielectric constant of at least one layer, a refractive index of at least one layer, a stress of at least one layer, a strain of at least one layer and a surface roughness of a measurement site, such as measurement site 116. It is appreciated that each PV category includes a range of values that the measurement site may have and still be considered part of the PV category. Any measurement site 116 on SDW 110 that is characterized by a value within the range of values of a particular PV category is said to be a member of that PV category.

For example, a PV category which classifies thickness could have a range of values from 10 nm-100 nm, more preferably from 10 nm-50 nm, and most preferably from 10 nm-30 nm. It is appreciated that the ranges of the PV categories may be identical, but need not be. For example, if the PV categories classify thickness, some PV categories may include values within a range of 50 nm, and other PV categories may include values within a range of 10 nm. It is further appreciated that values of the PV categories may be contiguous, but need not be. By way of example, in an embodiment wherein the PV categories classifies thicknesses in a range of 50-100 nm, first, second and third representative PV categories in database 120 may have respective characteristic thickness values of 20.0 μm-20.1 μm, 20.1 μm-20.2 μm and 20.30 μm-20.35 μm. In such a case, measurement site 116 having layers with a combined thickness of 20.14 μm is a member of the second PV category, and measurement site 116 having layers with a combined thickness of 20.01 μm is a member of the first PV category.

It is a particular feature of the present invention that each of the PV categories is associated with a single parameter set which is particularly suited for use by MMT 102 when generating the quality metric for measurement sites 116 being a member of that PV category.

It is appreciated that each of the parameter sets includes one or more measurement and/or analysis parameter for use by MMT 102 when generating the quality metric for measurement site 116. The parameter sets preferably include at least one of: suitable values of one or more measurement parameters and analysis algorithm parameters.

In an embodiment wherein the parameter sets include suitable values of one or more measurement parameters and MMT 102 is an imaging-based MMT, the measurement parameters preferably include at least one of, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest within measurement site 116, a polarization of light used in misregistration measurement, at least one value of at least one wavelength of light used in misregistration measurement, a bandwidth of wavelengths of light used in misregistration measurement, an intensity of light used in misregistration measurement, a focal depth used in misregistration measurement, a focus offset value used in misregistration measurement, an apodizer used in misregistration measurement and an optics channel used in misregistration measurement.

In an embodiment wherein the parameter sets include suitable values of one or more measurement parameters and MMT 102 is a scatterometry-based MMT, the measurement parameters preferably include at least one of, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest within measurement site 116, a polarization of light used in misregistration measurement, at least one value of at least one wavelength of light used in misregistration measurement, a bandwidth of wavelengths of light used in misregistration measurement, an intensity of light used in misregistration measurement, a focal depth used in misregistration measurement, a focus offset value used in misregistration measurement, a numerical aperture used in misregistration measurement and a camera used in misregistration measurement.

In an embodiment wherein the parameter sets include analysis algorithm parameters, the analysis algorithm parameters preferably include at least one of, inter alia, weighting rules and geometric corrections. The weighting rules preferably determine the respective weights given to misregistration measurement data generated using different measurement parameters. For example, if misregistration measurement data is generated using multiple wavelengths of incident radiation, the weighting rules determine the relative weight given to the misregistration measurement data associated with each of the wavelengths of the incident radiation.

The geometric corrections adjust misregistration measurement data to account for the fact that structures in SDW are tilted. The geometric corrections are particularly useful in embodiments wherein SDW 110 has a large thickness gradient, such as a thickness gradient larger than 50 nm/10 µm, larger than 100 nm/10 µm, larger than 250 nm/10 µm, larger than 500 nm/10 µm, larger than 800 nm/10 µm, larger than 1 µm/10 µm, larger than 1.5 µm/10 µm or larger than 2 µm/10 µm. Specifically, in an embodiment wherein thicknesses do not vary between different sites on SDW 110, typical distances in the misregistration measurement data represent distances within a plane generally parallel to the plane defined by top surface 112 of SDW 110. However, in an embodiment with relatively large thickness variations, typical distances in the misregistration measurement data have components both within the plane generally parallel to the plane defined by top surface 112 of SDW 110 and along a direction generally perpendicular to the plane defined by top surface 112 of SDW 110. Therefore, geometric corrections provide analysis algorithm parameters that suitably decompose distances in the misregistration measurement data into a component within the plane generally parallel to the plane defined by top surface 112 of SDW 110 and a component along a direction generally perpendicular to the plane defined by top surface 112 of SDW 110.

Database 120 may be populated using any suitable method. In one embodiment of the present invention, MMT 102 measures SDW 110 during a dedicated training procedure, during which PV categories and suitable parameter sets therefor are identified, and database 120 is populated thereby. Examples of such suitable methods may be found in, inter alia, U.S. patent application Ser. No. 16/619,847, and PCT Patent Application No. PCT/US2019/033019.

System 100 preferably further includes a process variation accommodation engine (PVAE) 130. PVAE 130 preferably includes a measurement site process variation category associator (MSPVCA) 132, which preferably associates measurement site 116 with a measurement site process variation category (MSPVC), the MSPVC being one of the PV categories in database 120. Preferably, MSPVCA 132 associates measurement site 116 with the MSPVC at least partially based on an MMT output relating to measurement site 116. In a preferred embodiment of the present invention, the MMT output is generated by MMT 102. In another embodiment of the present invention, the MMT output is generated by a tool other than MMT 102.

It is a particular feature of the present invention that MSPVCA 132 associates measurement site 116 with the MSPVC during runtime, that is, MSPVCA 132 associates measurement site 116 with the MSPVC substantially immediately upon receiving the MMT output and substantially immediately prior to MMT 102 measuring misregistration of measurement site 116.

In an embodiment wherein MMT 102 is an imaging-based MMT, the MMT output is preferably at least one of: a reflectance of measurement site 116, a spectral dependency of a reflectance of measurement site 116, a location of measurement site 116 on SDW 110, a Linnik interferogram shape relating to measurement site 116, a tool-induced-shift (TIS) value of measurement site 116 and a focus offset value of measurement site 116.

The location of measurement site 116 on SDW 110 can be particularly useful in determining the PV category of measurement site 116 if SDW 110 exhibits a known or readily extrapolated correlation between the PV categories with the locations. For example, some fabrication processes, such as spin-on coating, often form layers having thicknesses that are larger near edges of SDW 110 and smaller near central regions of SDW 110.

The Linnik interferogram shape preferably includes at least one of a Linnik interferogram amplitude, the amplitude preferably being either a maximum Linnik interferogram amplitude or a ratio of Linnik interferogram amplitudes, a Linnik interferogram center of mass, and a Linnik interferogram approximate symmetry, such as a location of the maximum amplitude or of the center of mass.

In one embodiment of the present invention, the TIS value of measurement site 116 is generated by at least one measurement of measurement site 116 for which the MSPVC is selected. In another embodiment of the present invention, the TIS value of measurement site 116 is generated by at least one measurement of at least one measurement site intended to be similar or identical to measurement site 116. In one embodiment of the present invention, the TIS value of measurement site 116 is generated by comparing outputs from multiple, preferably two, measurements of a single measurement site, as described in Sullivan, Neal, and Shin, Jennifer, "Overlay metrology: the systematic, the random and the ugly," AIP Conference Proceedings 449, 502 (1998). In another embodiment of the present invention, the TIS value of measurement site 116 is an estimated TIS value, which is based on an output signal generated by a single measurement of a measurement site and an estimation model, as described in U.S. patent application Ser. No. 16/640,783.

It is appreciated that a focus offset value quantifies a difference between an interference focal position, which substantially maximizes a constructive interference of incident radiation used by MMT 102, and a contrast focal position, which substantially maximizes an image contrast of an output signal generated by MMT 102. Since process variations affect the interference focal position and the contrast focal position differently, the focus offset value contains information about process variations, and thus a particular focus offset value can be associated with a particular PV category.

In one embodiment of the present invention, the focus offset value of measurement site 116 is generated by at least one measurement of measurement site 116 for which the MSPVC is selected. In another embodiment of the present invention, the focus offset value of measurement site 116 is generated by at least one measurement of at least one measurement site intended to be similar or identical to measurement site 116.

In one embodiment of the present invention, the focus offset value of measurement site 116 is generated using a method similar to a method which is described in U.S. patent application Ser. No. 15/562,556. In another embodiment of the present invention, the focus offset value of measurement site 116 is a machine-learning focus value, which is generated using a machine-learning method, such as a method which is described in U.S. patent application Ser. No. 17/060,372.

In an embodiment wherein MMT 102 is a scatterometry-based MMT, the MMT output is preferably at least one of: a reflectance of measurement site 116, a spectral dependency of a reflectance of measurement site 116, a location of measurement site 116 on SDW 110 and an arc position within an output signal generated by MMT 102.

As described in U.S. Pat. No. 10,203,200, the output signal generated by MMT 102 may contain an arc, the position of which within the output signal can be correlated to a particular process variation. Thus, in one embodiment of the present invention, the arc position within the output signal generated by MMT 102 is used to associate measurement site 116 with the MSPVC.

In one embodiment of the present invention, system 100 reports at least one value of the MSPVC of measurement site 116, and system 100 alerts a user if a predetermined tolerance is exceeded by at least one value of the MSPVC of measurement site 116. Preferably, the at least one value of the MSPVC includes at least one of the thickness of at least one layer, the dielectric constant of at least one layer, the refractive index of at least one layer, the stress of at least one layer, the strain of at least one layer and the surface roughness of measurement site 116.

System 100 preferably further includes a measurement site parameter set retriever (MSPSR) 134, which retrieves a measurement site parameter set (MSPS) corresponding to the MSPVC. Preferably, upon determining which of the PV categories of database 120 is suitable for use as the MSPVC, MSPSR 134 retrieves the MSPS from database 120, the MSPS being the parameter set in database 120 which corresponds to the MSPVC.

Additionally, system 100 preferably includes a measurement site parameter set communicator (MSPSC) 136, which communicates the MSPS to MMT 102. In one embodiment of the present invention, MSPSC 136 communicates the MSPS to MMT 102 directly. In another embodiment of the present invention, MSPSC 136 communicates the MSPS to an additional component, and the additional component communicates the MSPS to MMT 102.

Preferably, system 100 is used during misregistration measurements of SDW 110 by MMT 102. Therefore, system 100 seeks to minimize the throughput impact of selecting appropriate parameters sets. Preferably, a delay between the provision of the MMT output to PVAE 130 and the communication of the MSPS to MMT 102 is less than 5 s, more preferably less than 4 s, even more preferably less than 2 s, and most preferably less than 1 s.

Reference is now made to FIG. 2, which is a simplified flowchart illustrating a method 200 for use with system 100. As described hereinabove, method 200 is preferably part of a manufacturing process for semiconductor devices. It is appreciated that the illustrated portion of method 200 typically begins after the formation of at least two layers on SDW 110.

Preferably, prior to a start of method 200, database 120 is populated with a plurality of PV categories and a corresponding plurality of parameter sets, as described hereinabove with reference to FIGS. 1A & 1B. It is appreciated the plurality of PV categories and corresponding plurality of parameter sets may be any suitable PV categories and parameter sets, as described hereinabove with reference to FIGS. 1A & 1B. As seen in FIG. 2, at a first step 202, the plurality of PV categories with a corresponding plurality of parameter sets are provided. Preferably, the plurality of PV categories with a corresponding plurality of parameter sets are provided by making database 120 accessible to PVAE 130.

At a next step 204, the MMT output relating to measurement site 116 that is being measured by MMT 102 is preferably generated by MMT 102 and communicated to MSPVCA 132. In another embodiment of the present invention, the MMT output relating to measurement site 116 that is being measured by MMT 102 is generated by a tool other than MMT 102 and communicated to MSPVCA 132. The MMT output may be any suitable MMT output, as described hereinabove with reference to FIGS. 1A & 1B. Thereafter, at a next step 206, MSPVCA 132 preferably associates measurement site 116 from step 204, at least partially based on the MMT output from step 204, with an MSPVC, which is one of the plurality of PV categories provided at step 202. It is appreciated that MSPVC may be any suitable MSPVC and that MSPVCA 132 may use any suitable data to associate measurement site 116 with the MSPVC, as described hereinabove with reference to FIGS. 1A & 1B.

At a next step 208, as described hereinabove with reference to FIGS. 1A & 1B, an MSPS is retrieved, preferably by MSPSR 134, typically from a database such as database 120, the MSPS being the parameter set which corresponds to the MSPVC.

At a next step 210, as described hereinabove with reference to FIGS. 1A & 1B, the MSPS retrieved at step 208 is preferably communicated, preferably by MSPSC 136, to MMT 102, either directly or indirectly.

At a next step 212, MMT 102 preferably uses the MSPS of step 210 to generate at least one quality metric of measurement site 116. As described hereinabove, in a preferred embodiment of the present invention, the at least one quality metric indicates at least one misregistration value for the different layers between which misregistration was measured at measurement site 116.

Preferably as part of step 212, MMT 102 measures measurement site 116, thereby generating a corresponding plurality of misregistration measurement data, and analyzes the misregistration measurement data, thereby generating the at least one quality metric. Furthermore, as part of step 212, the MSPS is preferably used in at least one of the measuring measurement site 116 and the analysis of the misregistration measurement data, both of which are preferably performed at step 212.

At an optional next step 214, at least one of the least one quality metric generated at step 212 is preferably used in a fabrication process of a semiconductor device wafer. In one embodiment of the present invention, as part of step 214, the quality metric generated at step 212 is used to generate an adjusted set of fabrication parameters, and the adjusted set of fabrication parameters are used to fabricate at least one layer of a semiconductor device wafer, thereby ameliorating a misregistration between layers thereof. In another embodiment of the present invention, as part of step 214, the quality metric generated at step 212 is used to determine that misregistration between different layers of semiconductor device wafer 116 is within a predetermined tolerance, and the fabrication thereof continues without adjustment due to method 200.

In one example of method 200, database 120 is populated using the method described in PCT Application No. PCT/US2019/033019, and at step 202, database 120 is made accessible to PVAE 130. Then, at step 204, a spectral reflectance curve is generated for measurement site 116. It is appreciated that data contained in a "spectral reflectance curve" is a spectral dependency of a reflectance. At step 206, MSPVCA 132 associates measurement site 116, at least partially based on the spectral reflectance curve generated at step 204, with an MSPVC, the MSPVC being the PV category of step 202 for measurement sites having thickness values of 20.30 μm-20.35 μm. At step 208, MSPSR 134 preferably retrieves an MSPS from database 120, which corresponds to the PV category for measurement sites having thickness values of 20.30 μm-20.35 μm.

Thereafter, at step 210, MSPSC 136 communicates the MSPS to MMT 102, and at step 212, MMT 102 measures measurement site using the measurement parameters of the MSPS, thereby generating a plurality of misregistration measurement data for measurement site 116, and analyzes the misregistration measurement data using the analysis parameters of the MSPS, thereby generating a misregistration value for measurement site 116.

Thereafter, at step 214, if the misregistration value generated at step 212 is found to be outside of the predetermined tolerance, an adjusted set of fabrication parameters is generated, a top layer is removed from SDW 110 and a layer is formed on SDW 110 using the adjusted set of fabrication parameters generated at step 214.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A system comprising:
  a misregistration metrology tool (MMT); and
  a database including a plurality of process variation (PV) categories and a corresponding plurality of parameter sets; and
  a process variation accommodation engine (PVAE) comprising:
    a measurement site process variation category associator (MSPVCA) operative to associate a measurement site being measured by said MMT during runtime, at least partially based on an MMT output relating to said measurement site, with a measurement site process variation category (MSPVC), said MSPVC being one of said plurality of PV categories;
    a measurement site parameter set retriever (MSPSR) operative to retrieve a measurement site parameter set (MSPS) corresponding to said MSPVC, wherein said MSPS comprises analysis algorithm parameters, and wherein said analysis algorithm parameters comprise weighting rules that determine weights for said MSPS; and
    a measurement site parameter set communicator (MSPSC) operative to communicate said MSPS to said MMT; and
  wherein said MMT is configured to:
    measure said measurement site on a wafer based on said MSPS thereby generating misregistration measurement data; and
    analyze said misregistration measurement data based on said MSPS thereby generating at least one quality metric of said measurement site, wherein said quality metric indicates at least one misregistration value for different layers between which misregistration was measured at said measurement site.

2. The system according to claim 1, wherein said plurality of PV categories characterize at least one of:
  a thickness of at least one layer;
  a dielectric constant of at least one layer;
  a refractive index of at least one layer;
  a stress of at least one layer;
  a strain of at least one layer; or
  a surface roughness of said measurement site.

3. The system according to claim 2, wherein said system reports a value for at least one of and/or alerts a user if a predetermined tolerance is exceeded by at least one of:
  said thickness of at least one layer;
  said dielectric constant of at least one layer;
  said refractive index of at least one layer;
  said stress of at least one layer;
  said strain of at least one layer; or
  said surface roughness of said measurement site.

4. The system according to claim 1, wherein said MMT output comprises a reflectance of said measurement site, a spectral dependency of a reflectance of said measurement site, or a location of said measurement site on said wafer.

5. The system according to claim 1, wherein said MMT comprises an imaging-based MMT.

6. The system according to claim 5, wherein said MMT output comprises a Linnik interferogram shape relating to said measurement site.

7. The system according to claim 6, wherein said Linnik interferogram shape comprises at least one of:
  a Linnik interferogram amplitude;
  a Linnik interferogram center of mass; or
  a Linnik interferogram approximate symmetry.

8. The system according to claim 5, wherein said MMT output comprises a tool-induced-shift (TIS) value of said measurement site.

9. The system according to claim 8, wherein said TIS value is an estimated TIS value, said estimated TIS value being based on an output signal generated by a single measurement of said measurement site and an estimation model.

10. The system according to claim 5, wherein said MMT output comprises a focus offset value of said measurement site.

11. The system according to claim 10, wherein said focus offset value is a machine-learning focus value, said machine-learning focus value being generated by a machine-learning method.

12. The system according to claim 1, wherein said MMT comprises a scatterometry-based MMT.

13. The system according to claim 12, wherein said MMT output comprises an arc position within an output signal generated by said scatterometry-based MMT.

14. The system according to claim 1, wherein said MSPS comprises values of one or more measurement parameters, and wherein said one or more measurement parameters comprises at least one of:
  a linear position of a wafer stage used in misregistration measurement;
  an azimuthal orientation of a wafer stage used in misregistration measurement;
  an elevation angular orientation of a wafer stage used in misregistration measurement;
  an axis along which misregistration is measured;
  a region of interest within said measurement site;
  a polarization of light used in misregistration measurement;
  at least one value of at least one wavelength of light used in misregistration measurement;

a bandwidth of wavelengths of light used in misregistration measurement;
an intensity of light used in misregistration measurement;
a focal depth used in misregistration measurement;
an apodizer used in misregistration measurement;
an optics channel used in misregistration measurement;
a numerical aperture used in misregistration measurement;
a camera used in misregistration measurement; or
a focus offset value used in misregistration measurement.

15. The system according to claim 1, wherein said analysis algorithm parameters further comprise geometric corrections to account for tilt of structures in said wafer.

16. The system according to claim 1, wherein said PVAE communicates said MSPS to said MMT less than 5 s after said MMT output is provided to said PVAE.

17. A system for measuring misregistration of a plurality of measurement sites on a semiconductor device wafer, the system comprising:
    a misregistration metrology tool (MMT) operative to provide an MMT output relating to a measurement site being measured thereby;
    a database including a plurality of process variation (PV) categories and a corresponding plurality of parameter sets; and
    a process variation accommodation engine (PVAE) comprising:
        a measurement site process variation category associator (MSPVCA) operative to associate said measurement site being measured by said MMT during runtime, at least partially based on said MMT output, with a measurement site process variation category (MSPVC), said MSPVC being one of said plurality of PV categories;
        a measurement site parameter set retriever (MSPSR) operative to retrieve a measurement site parameter set (MSPS) corresponding to said MSPVC, wherein said MSPS comprises analysis algorithm parameters, and wherein said analysis algorithm parameters comprise weighting rules that determine weights for said MSPS; and
        a measurement site parameter set communicator (MSPSC) operative to communicate said MSPS to said MMT;
    wherein said MMT is configured to:
        measure said measurement site on a wafer based on said MSPS thereby generating said MMT output in the form of misregistration measurement data; and
        analyze said misregistration measurement data based on said MSPS thereby generating at least one quality metric of said measurement site, wherein said quality metric indicates at least one misregistration value for different layers between which misregistration was measured at said measurement site.

18. The system according to claim 17, and wherein said PVAE communicates said MSPS to said MMT less than 5 s after said MMT output is provided to said PVAE.

19. A method for measuring misregistration of a plurality of measurement sites on a semiconductor device wafer, the method comprising:
    providing a plurality of process variation (PV) categories with a corresponding plurality of parameter sets;
    generating a misregistration metrology tool (MMT) output relating to a measurement site being measured by an MMT;
    associating said measurement site being measured by said MMT during runtime, at least partially based on said MMT output, with a measurement site process variation category (MSPVC), said MSPVC being one of said plurality of PV categories;
    retrieving a measurement site parameter set (MSPS) corresponding to said MSPVC, wherein said MSPS comprises analysis algorithm parameters, and wherein said analysis algorithm parameters comprise weighting rules that determine weights for said MSPS;
    communicating said MSPS to said MMT; and
    measuring said measurement site with said MMT based on said MSPS thereby generating a corresponding plurality of misregistration measurement data.

20. The method according to claim 19, further comprising using said MSPS in a generation of at least one quality metric of said measurement site, and wherein said generation of said at least one quality metric comprises:
    analyzing said misregistration measurement data, thereby generating said at least one quality metric; and wherein:
    said MSPS is used in at least one of:
        said measuring said measurement site; or
        said analyzing said misregistration measurement data.

21. The method according to claim 19, further comprising using said at least one quality metric in a fabrication process of a semiconductor device wafer.

22. The method according to claim 19, wherein said communicating said MSPS to said MMT comprises communicating said MSPS to said MMT less than 5 s after a provision of said MMT output to said PVAE.

* * * * *